(12) United States Patent
Oba et al.

(10) Patent No.: US 9,868,629 B2
(45) Date of Patent: Jan. 16, 2018

(54) SEMICONDUCTOR DEVICE (71) Applicant: DENSO CORPORATION, Kariya, Aichi-pref. (JP)

(72) Inventors: Nobukazu Oba, Kariya (JP); Yasuhiro Yamashita, Kariya (JP); Wataru Kobayashi, Kariya (JP); Eiji Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/300,363

(22) PCT Filed: Apr. 17, 2015

(86) PCT No.: PCT/JP2015/002123
§ 371 (c)(1),
(2) Date: Sep. 29, 2016

(87) PCT Pub. No.: WO2015/162890
PCT Pub. Date: Oct. 29, 2015

(65) Prior Publication Data
US 2017/0144882 A1    May 25, 2017

(30) Foreign Application Priority Data

Apr. 23, 2014 (JP) .................. 2014-089517

(51) Int. Cl.
*G01L 7/06* (2006.01)
*G01K 13/02* (2006.01)
(Continued)

(52) U.S. Cl.
CPC .......... *B81B 7/0058* (2013.01); *G01L 9/0054* (2013.01); *G01L 23/24* (2013.01); *B81B 2201/0264* (2013.01)

(58) Field of Classification Search
CPC ... G01K 1/14; G01K 7/16; G01K 7/22; G01L 19/00; G01L 19/04; G01L 19/14
(Continued)

(56) References Cited

U.S. PATENT DOCUMENTS

2008/0250862 A1* 10/2008 Nakabayashi ........... G01K 1/18
73/756
2013/0078423 A1    3/2013 Sutou et al.
(Continued)

FOREIGN PATENT DOCUMENTS

| JP | 2008-082768 A | 4/2008 |
|---|---|---|
| JP | 2010-019663 A | 1/2010 |
| JP | 2010-101885 A | 5/2010 |

*Primary Examiner* — Kimberly Rizkallah
*Assistant Examiner* — Brian Turner
(74) *Attorney, Agent, or Firm* — Posz Law Group, PLC (57) ABSTRACT

A semiconductor device includes: a semiconductor element; a case; a terminal made of a conductive material and embedded in the case, a part of the terminal being exposed to the outside, having an outermost surface that includes a first film, and having a base portion; a bonding wire that is connected to the first film and electrically connects the semiconductor element and the terminal; and a protection member that is more flexible than the case and covers a contact portion of the terminal contacting with the bonding wire. The first film is removed from an area around the contact portion with the bonding wire in the part of the terminal being exposed to the outside, causing the base portion to be exposed. An exposed portion of the base portion and the protection member adhere to each other.

15 Claims, 3 Drawing Sheets (51) Int. Cl.
*G01M 15/04* (2006.01)
*G01L 19/04* (2006.01)
*B81B 7/00* (2006.01)
*G01L 9/00* (2006.01)
*G01L 23/24* (2006.01)

(58) Field of Classification Search
USPC .................... 73/715, 702, 706, 708; 257/415
See application file for complete search history.

(56) References Cited

U.S. PATENT DOCUMENTS

| | | |
|---|---|---|
| 2014/0305914 A1 | 10/2014 | Sutou et al. |
| 2016/0207148 A1 | 7/2016 | Kobayashi et al. |
| 2016/0267371 A1* | 9/2016 | Hosaka ............ G06K 19/07747 |

* cited by examiner

SEMICONDUCTOR DEVICE

CROSS REFERENCE TO RELATED APPLICATIONS

The present application is a U.S. national stage of International Application No. PCT/JP2015/002123 filed on Apr. 17, 2015 and is based on based on Japanese Patent Application No. 2014-89517 filed on Apr. 23, 2014, the disclosures of which are incorporated herein by reference.

TECHNICAL FIELD

The present disclosure relates to a semiconductor device that includes: a terminal having a part exposed to the outside and also having a film made of Au or other material on an outermost surface; a bonding wire connected to the film; and a protection member covering a contact portion of the terminal with the bonding wire.

BACKGROUND ART

There has been conventionally known a semiconductor device that includes: a terminal having a part exposed to the outside and also having a film made of Au or other material on an outermost surface thereof; a bonding wire connected to the film; and a protection member covering a contact portion of the terminal with the bonding wire.

This type of semiconductor device is proposed in Patent Literature 1, for example. A semiconductor device proposed in Patent Literature 1 includes a case having a semiconductor element, and a terminal embedded in the case such that a part of the terminal is exposed to the outside. The outermost surface of the exposed part is formed of a film made of Au or other material (hereinafter referred to as outermost film). The semiconductor device further includes a bonding wire made of Au or other material and connected to the outermost film of the terminal to electrically connect the semiconductor element and the terminal, and a protection member covering a contact portion of the terminal with the bonding wire.

The inventors of the present application have found the following. According to the semiconductor device which includes the case, and the terminal embedded in the case such that a part of the terminal is exposed to the outside like the semiconductor device described in Patent Literature 1, external moisture or the like may enter the interface between the case and terminal, reaching the interior of the semiconductor device in some cases. When moisture enters the interface between the terminal and the protection member, adhesion between the terminal and the protection member may lower. Consequently, the protection member may separate from the terminal. When the protection member separates from the outermost film of the terminal and becomes loose or movable, stress may concentrate on the bonding wire and cut the bonding wire.

PRIOR ART LITERATURE

Patent Literature

Patent Literature 1: JP 2010-19663 A

SUMMARY OF INVENTION

It is an object of the present disclosure to provide a semiconductor device that includes a case, and a terminal embedded in the case such that a part of the terminal is exposed to the outside, so that a protection member does not easily separate from the terminal.

A semiconductor device according to one aspect of the present disclosure includes: a semiconductor element; a case in which the semiconductor element is disposed; a terminal that is made of a conductive material and is embedded in the case, a part of the terminal being exposed to an outside, having an outermost surface including a first film that contains at least one of Au, Ag and Pd as a main component, and having as a base of the first film a base portion made of a conductive material different from material of the first film; a bonding wire that is connected to the first film and electrically connects the semiconductor element and the terminal; and a protection member that is more flexible than the case and covers a contact portion of the terminal contacting with the bonding wire.

The first film is removed from an area around the contact portion with the bonding wire in the part of the terminal being exposed to the outside, causing the base portion to be exposed; and an exposed portion of the base portion and the protection member adhere to each other.

According to the semiconductor device, the protection member around the contact portion of the terminal with the bonding wire does not easily separate from the base portion. Therefore, the protection member around the contact portion of the terminal with the bonding wire does not become loose or movable. As a result, stress concentration on the bonding wire does not easily occur, and cutting of the bonding wire does not also easily occur.

BRIEF DESCRIPTION OF DRAWINGS

The above and other aspects, features and advantages of the present disclosure will become more apparent from the following detailed description made with reference to the accompanying drawings. In the drawings.

PREFERRED EMBODIMENTS FOR CARRYING OUT INVENTION

Semiconductor devices according to embodiments are hereinafter described with reference to the drawings. In the following explanation of the respective embodiments, identical or similar parts are denoted with identical reference signs.

First Embodiment

A semiconductor device according to a first embodiment will be described with reference to FIGS. 1 to 3.

Figure 1:
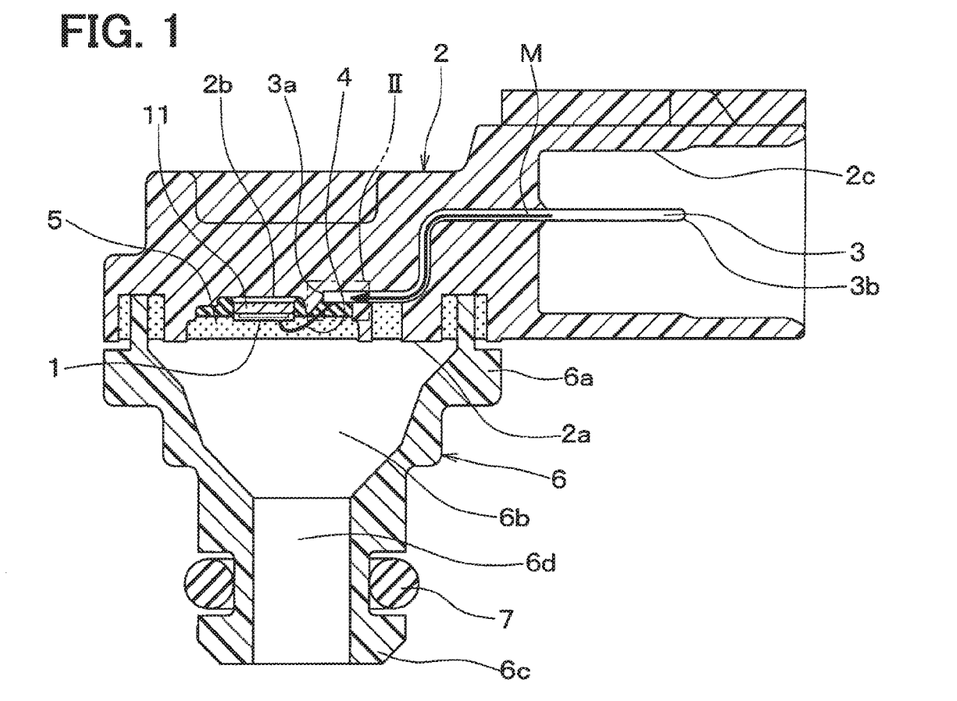
FIG. 1 is a diagram illustrating a cross-sectional configuration of a semiconductor device according to a first embodiment.

As illustrated in FIG. 1, the semiconductor device according to this embodiment includes a semiconductor element 1, a case 2, a terminal 3, a bonding wire 4, and a protection member 5. In the present embodiment, a semiconductor device functioning as a pressure sensor will be explained by way of example. This pressure sensor is mounted on an intake manifold to detect an engine intake pressure, for example.

The semiconductor element 1 is constituted of a pressure detection element that detects a pressure by utilizing a piezo resistance effect, and generates an electric signal corresponding to a detected value (the semiconductor element 1 is hereinafter referred to as a pressure detection element 1). The pressure detection element 1 is constituted as a sensor chip, and includes a sensing unit outputting an electric signal corresponding to a pressure. More specifically, the pressure detection element 1 includes the sensing unit that has a diaphragm functioning as a deformation portion, and a bridge circuit constituted of a diffused resistor or the like and disposed on the diaphragm, for example. The pressure detection element 1 is bonded and fixed to a pedestal 11 secured to a recess 2b of the case 2.

The case 2 is made of a resin material such as polyphenylene sulfide (PPS), polybutylene terephthalate (PBT), or epoxy resin, and is molded with a metal mold. The case 2 has the multiple terminals 3 formed by insert molding for connection to the outside. As illustrated in FIG. 1, the pressure detection element 1 is provided in the case 2. According to the semiconductor device of this embodiment, the recess 2b is formed in one end surface 2a of the case 2. The pressure detection element 1 is disposed in the recess 2b. A port 6 is connected to the case 2 and covers the one end surface 2a of the case 2. The case 2 further includes a recess 2c exposed to the outside. A tip 3b (described below) of each of the terminals 3 is disposed in the recess 2c so as to extend from the inside of the case 2 to the outside.

Each of the terminals 3 is a component made of a conductive material. As illustrated in FIG. 1, the terminal 3 has one tip 3a, and another tip 3b on the side opposite to the one tip 3a. Each of the terminals 3 is embedded in the case 2 such that the one tip 3a and the other tip 3b are respectively exposed to the outside. In each of the terminals 3, more specifically, the one tip 3a is exposed to the recess 2b of the case 2 whereas the other tip 3b is exposed to the inside of the recess 2c of the case 2. The one tip 3a may also be referred to as a first tip, and the other tip 3b may also be referred to as a second tip. The outside in this context represents a part other than the part embedded in the case 2.

Figure 2:
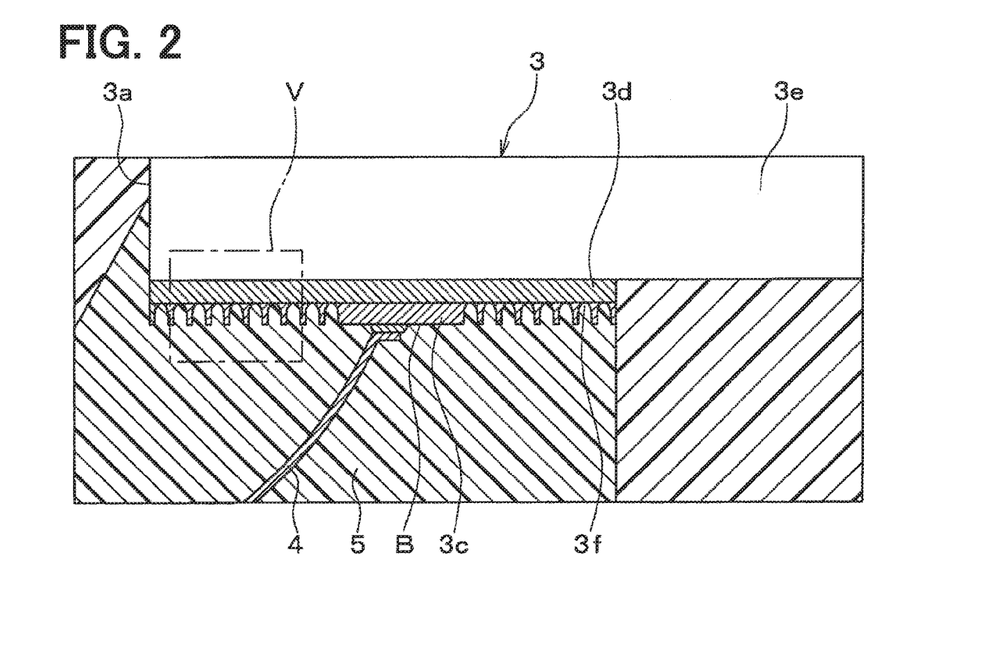
FIG. 2 is an enlarged view schematically illustrating an area II in FIG. 1.

As illustrated in FIG. 2, a film 3c made of a conductive material (hereinafter referred to as a first film) and a base portion 3d made of a conductive material different from the material for the first film 3c and functioning as a base of the first film 3c are formed on the outermost surface of an exposed portion to the recess 2b in the one tip 3a of each terminal 3.

The first film 3c is made of a conductive material containing at least one of Au, Ag, and Pd as a main component. The thickness of the first film 3c is set in a range from 0.5 µm to 2.5 µm. The first film 3c is formed by plating or the like and is configured to function as a bonding pad.

The base portion 3d is made of a conductive material containing at least one of Ni, Pd, and Cu as a main component. The base portion 3d is a film formed by plating or other methods on the surface of a substrate 3e, made of Au, Cu or other material, of the terminal 3. The thickness of the base portion 3d is set in a range from 2 µm to 6 µm.

The base portion 3d is made of a material having higher adhesiveness to the protection member 5 (described below) than the corresponding adhesiveness of the material constituting the first film 3c. When the first film 3c is made of Au, for example, the base portion 3d is made of Ni. Thus, the first film 3c made of Au is basically bonded to the protection member 5 (described below) only by van der Waals binding, so that the first film 3c only obtains low adhesiveness. However, when the base portion 3d is made of Ni, the surface of the base portion 3d becomes an oxygen-terminated surface similarly to the protection member 5. Thus, the base portion 3d is easily bonded to the protection member 5 (described below) by covalent bond or hydrogen bond. Therefore, the base portion 3d easily obtains high adhesiveness.

Figure 3:
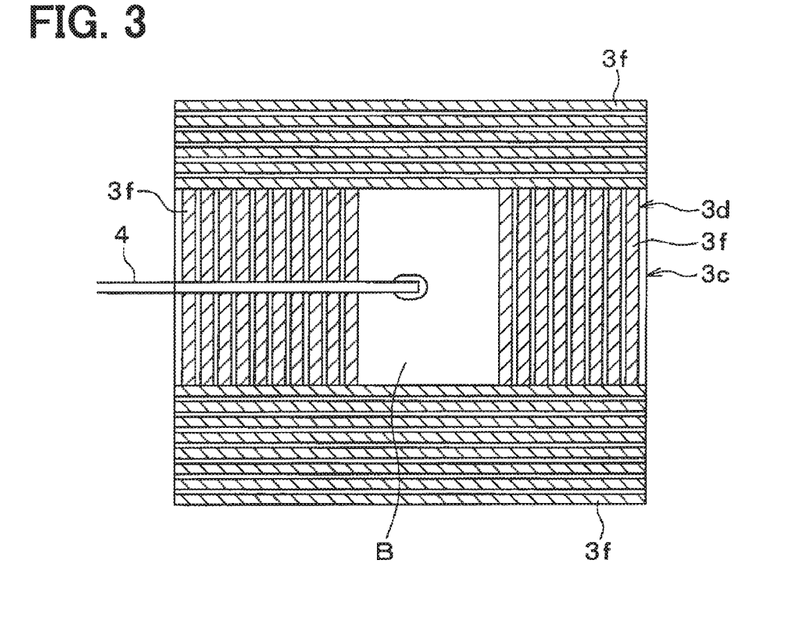
FIG. 3 is a plan view illustrating a portion of one tip of a terminal 3, which portion is exposed to a recess, as viewed upward from below of FIG. 1.

As illustrated in FIGS. 2 and 3, multiple grooves 3f are formed around a pad portion B corresponding to a part of the first film 3c. The grooves 3f linearly extend as viewed in the normal direction of the surface of the first film 3c. As illustrated in FIG. 2, the grooves 3f penetrate the first film 3c in the thickness direction of the first film 3c. The bottoms of the grooves 3f are formed in the base portion 3d. Each of the grooves 3f has a width ranging from 5 µm to 300 µm in the left-right direction as viewed in the figure. According to this embodiment, the grooves 3f remove the first film 3c from an area around the pad portion B of the first film 3c to allow exposure of the base portion 3d through the grooves 3f. Particularly in this embodiment, the grooves 3f are so formed as to surround the entire circumference of the pad portion B of the first film 3c as viewed in the normal direction of the surface of the first film 3c. Accordingly, the first film 3c is removed from the entire circumference of the pad portion B of the first film 3c to allow exposure of the base portion 3d through the grooves 3f. In the semiconductor device of this embodiment, the pad portion B of the first film 3c functions as a bonding pad of the bonding wire 4. According to this embodiment, the exposed portion of the base portion 3d through the grooves 3f adheres to the protection member 5.

For allowing removal of the first film 3c and exposure of the base portion 3d, laser beams are applied to the first film 3c in this embodiment. More specifically, laser beams generated by pulsed oscillation are sequentially applied to different positions of the surface of the first film 3c to fuse the surface of the first film 3c and allow removal of the first film 3c and exposure of the base portion 3d. According to this embodiment, the base portion 3d is not removed by laser beams. Therefore, the area of the base portion 3d corresponding to the bottoms of the grooves 3f is not removed, but becomes a substantially flat surface.

According to this embodiment, the position of a light source of laser beams is varied to different locations in each of the linear areas of the surface of the first film 3c corresponding to formation of the grooves 3f to apply laser beams to multiple positions in each linear area. Particularly in this embodiment, the light source of laser beams is shifted along each linear area of the surface of the first film 3c to sequentially apply the laser beams to the multiple positions in each linear area. After the first film 3c is fused with the laser beams by the foregoing method, the first film 3c is solidified to produce the grooves 3f. The laser beams employed herein may be preferably green lasers having a short wavelength (for example, around 500 nm). Laser beams having a short wavelength are easily absorbed by a laser beam receiving object (the first film 3c in this example). Accordingly, the reduction of energy of laser beams for removal of the laser beam receiving object (the first film 3c) is achievable when laser beams having a short wavelength are used.

The portion formed at the other tip 3b of the terminal 3 and exposed to the inside of the recess 2c constitutes a connector portion for connection to an external device. Accordingly, the semiconductor device of this embodiment is electrically connectable to an external device via the other tip 3b.

The bonding wire 4 is a member electrically connecting the pressure detection element 1 and the terminal 3 and is made of a conductive material such as Au, Cu, or Al. The bonding wire 4 is connected to the pressure detection element 1 and the pad portion B of the terminal 3.

A circuit chip (not shown) is also provided in the recess 2b of the case 2. For example, this circuit chip includes a control circuit having functions of outputting a driving signal to the pressure detection element 1, outputting a detection signal to the outside, performing calculation and amplification for an electric signal received from the pressure detection element 1, and outputting the electric signal to the outside. The pressure detection element 1 and the circuit chip are connected via a bonding wire (not shown) different from the bonding wire 4.

As illustrated in FIG. 1, the inside of the recess 2b of the case 2 is filled with the protection member 5 made of a material more flexible than the material for the case. More specifically, the protection member 5 is made of a resin material having an excellent electric insulation property and chemical resistance such as fluorine gel and fluorine rubber, and having a Young's modulus approximately in a range from 0.5 MPa to 10 MPa. The protection member 5 is a member covering a contact portion of the terminal 3 with the bonding wire 4, for example. According to this embodiment, the protection member 5 covers the pressure detection element 1, the circuit chip, the terminal 3, the bonding wire 4, the connection portion between the pressure detection element 1 and the bonding wire 4, the connection portion between the terminal 3 and the bonding wire 4, and other portions. According to the semiconductor device of this embodiment, therefore, the protection member 5 is provided to protect the semiconductor device from chemicals, to secure electric insulation, and to prevent corrosion, for example. The protection member 5 adopted in this embodiment has a double-layer protection structure constituted by fluorine rubber or like material, and fluorine gel or like material. The protection member 5 is formed by injecting a constituent material of the protection member 5 into the recess 2b, and hardening the injected material.

According to the semiconductor device of this embodiment, therefore, the first film 3c is removed from the area around the exposed and contact portion of the terminal 3, which portion is exposed to the outside and in contact with the bonding wire 4, to allow exposure of the base portion 3d. In other words, the first film 3c is removed from an area around the contact portion with the bonding wire 4 in the part of the terminal 3 being exposed to the outside, causing the base portion 3d to be exposed. More specifically, the first film 3c is removed from the entire circumference of the exposed and contact portion of the terminal 3, which portion is exposed to the outside and in contact with the bonding wire 4, to allow exposure of the base portion 3d. In other words, the first film 3c is removed from an entire circumference of the contact portion with the bonding wire 4 in the part of the terminal 3 being exposed to the outside, causing the base portion 3d to be exposed. The base portion 3d and the protection member 5 adhere to each other at the exposed portion of the base portion 3d.

When the protection member 5 of this embodiment is made of a resin material, for example, the protection member 5 is basically bonded to the first film 3c (Au, Ag, Pd) only by van der Waals binding, but is bonded to the base portion 3d (Ni, Pd, Cu) by covalent bond or hydrogen bond. According to the semiconductor device of this embodiment, therefore, bonding between the protection member 5 and the first film 3c lowers by moisture due to weak bonding of van der Waals binding between the protection member 5 and the first film 3c, when external moisture enters the interface between the terminal 3 and the protection member 5 (see arrow M in FIG. 1). However, bonding between the protection member 5 and the base portion 3d is easily maintained by covalent bond or hydrogen bond connecting the protection member 5 and the base portion 3d. According to the semiconductor device of this embodiment, therefore, adhesion between the protection member 5 and the terminal 3 is easily maintained without separation of the protection member 5 from the terminal 3 even when external moisture enters the interface between the terminal 3 and the protection member 5. Accordingly, in the semiconductor device of this embodiment, the protection member 5 around the contact portion of the terminal 3 with the bonding wire 4 does not become loose or movable, and cutting of the bonding wire 4 decreases. As described in this embodiment, the protection member 5 made of a resin material adheres to the exposed portion of the base portion 3d. This structure is particularly advantageous in view of adhesion between the terminal 3 and the protection member 5.

According to the semiconductor device described in Patent Literature 1, the protection member adheres to the terminal only by contact with the first film (such as Au) having low adhesiveness. Therefore, the protection member is fixed to the terminal chiefly by adhesive force to the case. According to this structure, however, the adhesive force between the protection member and the case lowers when moisture indicated by the arrow M in FIG. 1 enters the interface between the case and the terminal. As a result, fixture between the protection member and the terminal is difficult to maintain. According to the semiconductor device of this embodiment, however, the protection member 5 adheres to the base portion 3d (Ni, Pd, Cu) as described above. Therefore, fixture between the protection member 5 and the terminal 3 is easy to maintain even when the adhesive force between the protection member 5 and the case 2 lowers due to moisture.

Particularly, the protection member 5 of the semiconductor device according to this embodiment is made of a material having a Young modulus ranging from 0.5 MPa to 10 MPa. Thus, adhesiveness between the protection member 5 made of a flexible material and the base portion 3d further increases. Accordingly, in the semiconductor device of this embodiment, the protection member 5 around the contact portion of the terminal 3 with the bonding wire 4 does not easily separate from the base portion 3d.

As illustrated in FIG. 1, the port 6 is provided to introduce a pressure medium into the pressure detection element 1. One end 6a of the port 6 is connected to the case 2 by an adhesive such that the port 6 covers the one end surface 2a of the case 2. A pressure detection chamber 6b is formed between the case 2 and the port 6 connected to each other. Another end 6c of the port 6 protrudes in the direction opposite to the case 2. A pressure introduction hole 6d formed inside the other end 6c extends from a protruded end of the other end 6c to the pressure detection chamber 6b. A pressure medium corresponding to a measurement target such as an intake air within an intake manifold is introduced into the pressure detection chamber 6b through the pressure introduction hole 6d to detect a pressure of the pressure medium by using the pressure detection element 1.

The port 6 is made of a resin material having heat resistance, such as PBT and PPS and is formed with a metal mold, similarly to the case 2. An O-ring 7 is provided on the outer circumference of the port 6 to allow airtight attachment of the semiconductor device to a sensor attachment portion (not shown) via the O-ring 7.

The semiconductor device according to this embodiment has the overall structure described above. The semiconductor device measures pressure of a pressure medium by using the pressure detection element 1 when the pressure medium is introduced into the pressure detection chamber 6b via the pressure introduction hole 6d.

According to the semiconductor device of this embodiment, the first film 3c is removed from the area around the exposed and contact portion of the terminal 3, which portion is exposed to the outside and is in contact with the bonding wire 4, to allow exposure of the base portion 3d. The exposed portion of the base portion 3d adheres to the protection member 5.

In the semiconductor device of this embodiment, therefore, the protection member 5 around the contact portion of the terminal 3 with the bonding wire 4 does not easily separate from the base portion 3d. Thus, the protection member 5 around the contact portion of the terminal 3 with the bonding wire 4 does not become loose or movable. As a result, stress does not easily concentrate on the bonding wire 4. Accordingly, the bonding wire 4 is not easily cut.

Particularly in the semiconductor device of this embodiment, the protection member 5 is made of a material having a Young modulus ranging from 0.5 MPa to 10 MPa.

Therefore, adhesiveness between the protection member 5 and the base portion 3d further increases according to the semiconductor device of this embodiment. Accordingly, separation of the protection member 5 around the contact portion of the terminal 3 with the bonding wire 4 from the base portion 3d further decreases.

Particularly in the semiconductor device of this embodiment, the first film 3c is removed from the entire circumference of the exposed and contact portion of the terminal 3 with the bonding wire 4 to allow exposure of the base portion 3d. The base portion 3d and the protection member 5 adhere to each other at the exposed portion of the base portion 3d.

Accordingly, the protection member 5 around the contact portion of the terminal 3 with the bonding wire 4 is made hard to peel off further from the base portion 3d.

Second Embodiment

Figure 4:
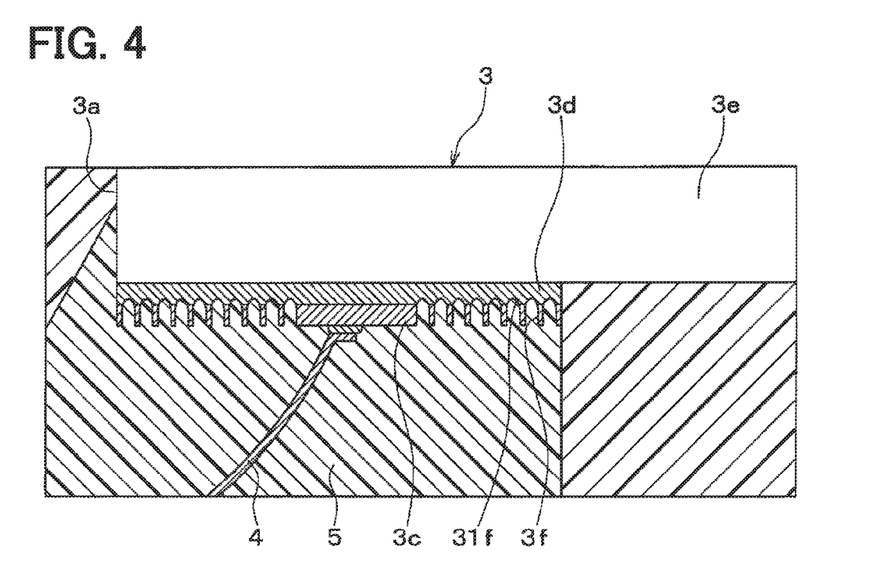
FIG. 4 is a diagram illustrating a semiconductor device according to a second embodiment, corresponding to FIG. 2 in the first embodiment.

A second embodiment will be described with reference to FIG. 4. This embodiment is different from the first embodiment in the configuration of the base portion 3d. Other parts are similar to the corresponding parts of the first embodiment, and therefore are not repeatedly explained.

Figure 5:
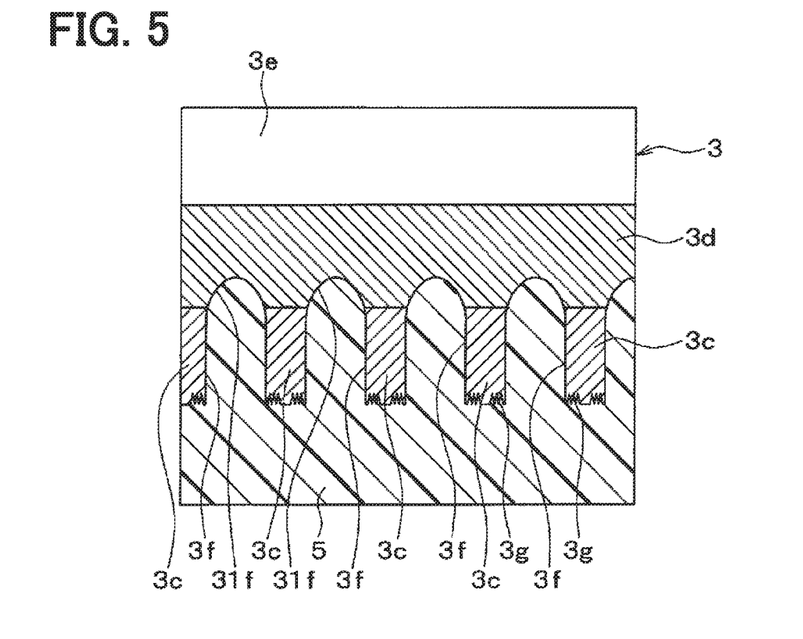
FIG. 5 is a diagram illustrating a semiconductor device according to a third embodiment, schematically showing an enlarged area V in FIG. 2 in the first embodiment.

According to the first embodiment, the base portion 3d is not removed with laser beams, and the area of the base portion 3d corresponding to the bottoms of the grooves 3f constitutes a substantially flat surface. According to the present embodiment, however, the area of the base portion 3d corresponding to the bottoms of the grooves 3f is removed with laser beams as illustrated in FIGS. 4 and 5. The bottoms of the grooves 3f are constituted by recesses 31f formed in the base portion 3d. In other words, the first film 3c according to this embodiment includes the grooves 3f penetrating the first film 3c, and having bottoms constituted by the recesses 31f formed in the base portion 3d. In this embodiment, therefore, the recesses 31f are formed in the exposed portion of the base portion 3d after removal of the first film 3c as described above. The protection member 5 adheres to the base portion 3d via the portion where the recesses 31f are formed.

The structure of the semiconductor device of this embodiment therefore increases engagement between the protection member 5 and the recesses 31f of the base portion 3d, thereby improving an anchor effect as a result of the engagement. Accordingly, adhesiveness between the base portion 3d and the protection member 5 of the semiconductor device of this embodiment further improves in comparison with the first embodiment. In this condition, the protection member 5 around the contact portion of the terminal 3 with the bonding wire 4 does not easily separate from the base portion 3d.

Third Embodiment

A third embodiment is described with reference to FIG. 5. This embodiment is different from the second embodiment in the configuration of the first film 3c. Other parts are similar to the corresponding parts of the second embodiment, and therefore are not repeatedly explained herein.

According to a semiconductor device of this embodiment, small recesses and protrusions 3g sized as described below (hereinafter referred to as small recesses and protrusions) are formed in the first film 3c around the grooves 3f as illustrated in FIG. 5. The small recesses and protrusions 3g include multiple protrusions sized to have an average height ranging from 1 to 500 nm, an average width ranging from 1 to 300 nm, and an average interval ranging from 1 to 300 nm.

According to this embodiment, therefore, higher shear strength, i.e., higher adhesiveness is obtainable in comparison with the second embodiment (the structure having no small recesses and protrusions 3g). Thus, adhesiveness between the protection member 5 and the first film 3c further increases. Accordingly, separation of the protection member 5 around the contact portion of the terminal 3 with the bonding wire 4 from the first film 3c (the terminal 3) further decreases in this embodiment in comparison with the second embodiment. A possible factor which increases the adhesiveness in this embodiment is an anchor effect produced by engagement between the protection member 5 and the grooves 3f. Other possible factors include enlargement of the contact area between the base portion 3d and the protection member 5 as a result of the presence of the small recesses and protrusions 3g, and an anchor effect produced by engagement between the protection member 5 and the protrusions of the small recesses and protrusions 3g.

The small recesses and protrusions 3g are formed under the following processing conditions. During formation of the grooves 3f, fusion in the manner described in the first embodiment with laser beams generated by pulsed oscillation is performed while setting the energy density to 100 J/cm$^2$ or lower, and the pulse width to 1 microsecond or smaller, to form the small recesses and protrusions 3g.

According to the trial and study given by the present inventors, the small recesses and protrusions 3g are not formed when the first film 3c is made of Cu, Al or the like other than the material described above (a conductive material containing at least one of Au, Ag and Pd as a chief component) (other conditions are similar). Similarly, the small recesses and protrusions 3g are not formed when the energy density is set to 150 J/cm² or 300 J/cm², for example, which is higher than 100 J/cm² (other conditions are similar). In addition, the small recesses and protrusions 3g are not formed when fusion is performed with laser beams generated by successive oscillation, instead of laser beams generated by pulsed oscillation (other conditions are similar). Under these conditions, the small recesses and protrusions 3g are not formed. According to the manufacturing method of this embodiment, the detailed mechanism concerning formation of the small recesses and protrusions 3g is not clarified at present. When laser beams are applied to a material having a high melting point, the material does not disappear but tends to remain at the same position in a fused state. In consideration of this point, it is conceivable that the use of a material having a high melting point for the first film 3c is one of the conditions for forming the small recesses and protrusions 3g according to this embodiment. It is also estimated that the small recesses and protrusions 3g are obtainable by emission of laser beams generated by pulsed oscillation to a material having a high melting point (Au, Ag, Pd), particularly with a low energy density (such as 100 J/cm² or lower) and a small pulse width (such as 1 microsecond or smaller) of the laser beams.

The energy density of laser beams needs to be set to a density sufficiently high for allowing sufficient removal of the first film 3c (for example, 3 J/cm² or higher for thickness of first film 3c in this embodiment). However, it is not preferable that the energy density of laser beams is excessively high. When the energy density of laser beams is excessively high, the first film 3c may be oxidized by heat of the laser beams, in which condition the function of the first film 3c as the bonding pad may be lost. Accordingly, it is preferable that the energy density of laser beams is set to 50 J/cm² or lower, for example.

Figure 6:
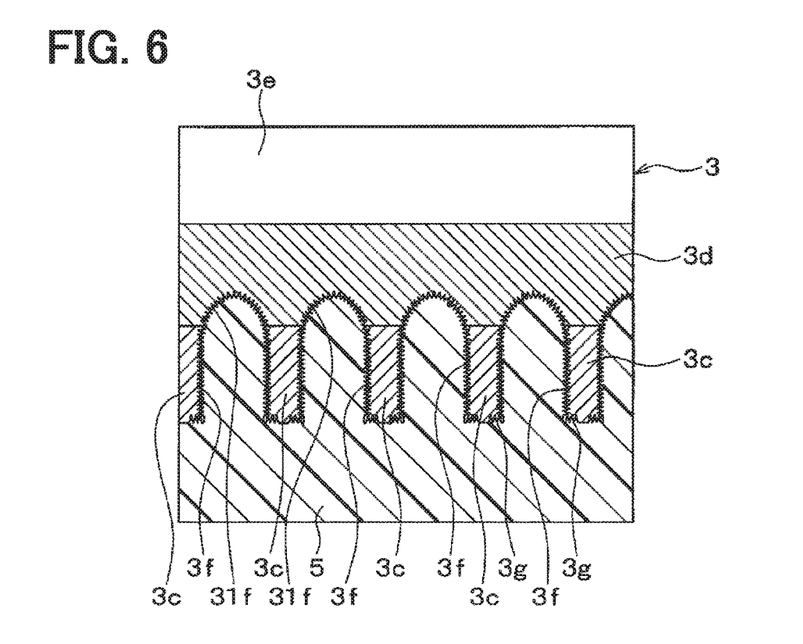
FIG. 6 is a diagram illustrating a semiconductor device according to another embodiment, corresponding to FIG. 5 in the third embodiment.

As illustrated in FIG. 6, the small recesses and protrusions 3g may be formed inside the grooves 3f (a part of first film 3c or base portion 3d) in this embodiment. Herein, higher shear strength, i.e., higher adhesiveness is obtainable, in which condition the adhesiveness between the protection member 5 and the first film 3c or the base portion 3d further increases. Accordingly, separation of the protection member 5 around the contact portion of the terminal 3 with the bonding wire 4 from the terminal 3 (first film 3c or base portion 3d) further decreases in this embodiment.

Depending on the energy density of laser beams or other conditions, a mixture of the first film 3c and the base portion 3d may be produced on the surface of the base portion 3d according to this embodiment. The mixture may constitute the small recesses and protrusions 3g.

Other Embodiments

The semiconductor device is not limited to those described in the respective embodiments.

For example, the base portion 3d is constituted of the film formed on the surface of the substrate 3e of the terminal 3 by plating or other methods according to the first to third embodiments. However, the base portion 3d is not limited to this example, but may be constituted of the substrate 3e of the terminal 3 in the first to third embodiments.

According to the second and third embodiments described herein, the recesses 31f are formed as the bottoms of the grooves 3f. However, the first film 3c may be removed from the entire outer circumference of the pad portion B depending on the conditions of the wavelength, energy density, irradiation time and the like of laser beams. The recesses 31f may be formed in the base portion 3d after removal of the first film 3c in this manner. For example, the recesses 31f may be formed in an area of the base portion 3d produced by removal of the first film 3c for a wide range in this embodiment.

According to the first to third embodiments, the semiconductor element 1 corresponds to the pressure detection element 1. However, the semiconductor element 1 is not limited to the pressure detection element 1.

While various embodiments, configurations, and aspects of the semiconductor device have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the semiconductor device.

The invention claimed is:

1. A semiconductor device comprising:
   a semiconductor element;
   a case in which the semiconductor element is disposed;
   a terminal that is made of a conductive material and is embedded in the case, a part of the terminal being exposed to an outside, having an outermost surface that includes a first film that contains at least one of Au, Ag and Pd as a main component, and further having, as a base of the first film, a base portion made of a conductive material different from material of the first film;
   a bonding wire that is connected to the first film and electrically connects the semiconductor element and the terminal; and
   a protection member that is more flexible than the case and covers a contact portion of the terminal contacting with the bonding wire, wherein
   the first film is removed from an area around the contact portion with the bonding wire in the part of the terminal being exposed to the outside, causing the base portion to be exposed, and
   an exposed portion of the base portion and the protection member bond to each other.

2. The semiconductor device according to claim 1, wherein:
   the first film is removed in irradiation of a laser beam, and the base portion is exposed.

3. The semiconductor device according to claim 1, wherein:
   the protection member is made of a material having a Young modulus ranging from 0.5 MPa to 10 MPa.

4. The semiconductor device according to claim 1, wherein:
   the first film is removed from an entire circumference of the contact portion with the bonding wire in the part of the terminal being exposed to the outside, causing the base portion to be exposed; and
   the exposed portion of the base portion and the protection member adhere to each other.

5. The semiconductor device according to claim 1, wherein:
   the terminal includes a first tip and a second tip on a side opposite to the first tip, the terminal being embedded in the case such that each of the first tip and the second tip is exposed to the outside;
   the first film and the base portion are provided at an exposed portion of the first tip of the terminal; and an exposed portion of the second tip of the terminal, the exposed portion being exposed to the outside, corresponds to a connector portion connecting with an external device.

6. The semiconductor device according to claim 1, wherein:
the exposed portion of the base portion exposed from the first film corresponds to a recess; and
the recess of the base portion and the protection member adhere to each other.

7. The semiconductor device according to claim 1, wherein:
the first film includes a groove that is linear and has a width ranging from 5 µm to 300 µm;
an exposed portion of the base portion, the exposed portion being exposed by the groove, adheres to the protection member; and
a plurality of protrusions sized to have an average height ranging from 1 nm to 500 nm, an average width ranging from 1 nm to 300 nm, and an average interval ranging from 1 nm to 300 nm, are provided around the groove to constitute small recesses and protrusions.

8. The semiconductor device according to claim 7, wherein:
small recesses and protrusions are provided inside the groove.

9. The semiconductor device according to claim 1, wherein
the first film includes a groove that is linear, and
an exposed portion of the base portion of the first film is exposed by the groove and bonds to the protection member.

10. The semiconductor device according to claim 9, wherein
the groove of the first film extends to a depth that exposes the exposed portion of the base portion of the first film.

11. The semiconductor device according to claim 1, wherein
the first film includes a plurality of grooves that each extend towards the base portion of the first film to a depth that exposes the base portion of the first film.

12. The semiconductor device according to claim 11, wherein
the plurality of grooves of the first film includes a plurality of protrusions.

13. The semiconductor device according to claim 12, wherein
the base portion of the first film includes a plurality of protrusion located at the exposed portion of the base portion within the plurality of grooves of the first film.

14. The semiconductor device according to claim 11, wherein
the plurality of grooves include two or more different sets of linear grooves that extend in different directions from each other across the first film.

15. The semiconductor device according to claim 1, wherein
the exposed portion of the base portion and the protection member bond to each other by at least one of covalent bonding and hydrogen boding.

* * * * *